US 8,970,539 B2

(12) United States Patent
Kwon et al.

(10) Patent No.: US 8,970,539 B2
(45) Date of Patent: Mar. 3, 2015

(54) ORGANIC LIGHT EMITTING DISPLAY APPARATUS

(75) Inventors: Do-Hyun Kwon, Yongin (KR); Choong-Youl Im, Yongin (KR); Il-Jeong Lee, Yongin (KR); Young-Dae Kim, Yongin (KR); Ju-Won Yoon, Yongin (KR); Jong-Mo Yeo, Yongin (KR); Cheol-Ho Yu, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 841 days.

(21) Appl. No.: 12/805,882

(22) Filed: Aug. 23, 2010

(65) Prior Publication Data

US 2011/0050604 A1 Mar. 3, 2011

(30) Foreign Application Priority Data

Sep. 2, 2009 (KR) .................. 10-2009-0082565

(51) Int. Cl.
| | | |
|---|---|---|
| *G06F 3/044* | (2006.01) | |
| *G06F 3/041* | (2006.01) | |
| *H01L 27/32* | (2006.01) | |
| *H01L 51/52* | (2006.01) | |

(52) U.S. Cl.
CPC .............. *G06F 3/0412* (2013.01); *G06F 3/044* (2013.01); *H01L 27/323* (2013.01); *H01L 27/3244* (2013.01); *H01L 27/3248* (2013.01); *H01L 51/5253* (2013.01)
USPC ............. 345/174; 345/173; 345/139; 345/76; 313/504; 313/509; 178/18.06

(58) Field of Classification Search
None
See application file for complete search history.

(56) References Cited

U.S. PATENT DOCUMENTS

| | | | |
|---|---|---|---|
| 7,084,933 | B2 | 8/2006 | Oh et al. |
| 2002/0171610 | A1 | 11/2002 | Siwinski et al. |
| 2003/0151049 | A1* | 8/2003 | Hotta et al. ................... 257/59 |
| 2004/0017362 | A1 | 1/2004 | Mulligan et al. |
| 2005/0035953 | A1 | 2/2005 | Woolley et al. |
| 2005/0253136 | A1* | 11/2005 | Ono et al. ..................... 257/40 |
| 2006/0147650 | A1* | 7/2006 | Park ............................ 428/1.1 |
| 2008/0035932 | A1* | 2/2008 | Oh .............................. 257/72 |
| 2008/0211395 | A1* | 9/2008 | Koshihara et al. ........... 313/504 |
| 2008/0224600 | A1* | 9/2008 | Im et al. ...................... 313/504 |
| 2009/0075438 | A1* | 3/2009 | Jo et al. ....................... 438/155 |
| 2009/0160817 | A1* | 6/2009 | Wu et al. ..................... 345/173 |
| 2009/0244028 | A1* | 10/2009 | Matsuo ........................ 345/174 |
| 2009/0267074 | A1* | 10/2009 | Kwon et al. ................. 257/72 |
| 2010/0007616 | A1* | 1/2010 | Jang ............................ 345/173 |
| 2010/0193790 | A1* | 8/2010 | Yeo et al. .................... 257/59 |

FOREIGN PATENT DOCUMENTS

| | | |
|---|---|---|
| JP | 11-039093 | 2/1999 |
| JP | 2002-366303 | 12/2002 |
| JP | 2008-216543 | 9/2008 |

(Continued)

*Primary Examiner* — Kent Chang
*Assistant Examiner* — Benjamin Morales Fernandez
(74) *Attorney, Agent, or Firm* — Lee & Morse, P.C.

(57) ABSTRACT

An organic light emitting display apparatus including a substrate, a first touch sensing electrode layer on the substrate, a first protective layer on the substrate, the first protective layer covering the first touch sensing electrode layer, a ground layer on the first protective layer, the ground layer being electrically grounded, an insulating layer on the ground layer, and an organic light emitting device on the insulating layer.

19 Claims, 6 Drawing Sheets

(56) References Cited

FOREIGN PATENT DOCUMENTS

| KR | 10-1996-0007993 B1 | 6/1996 |
| KR | 10 2004-0042485 A | 5/2004 |
| KR | 10 2005-0019914 A | 3/2005 |
| KR | 10-2006-0083129 A | 7/2006 |
| KR | 10 2008-0096977 A | 11/2008 |
| KR | 10-2009-0000921 A | 1/2009 |
| KR | 10-0898221 B1 | 5/2009 |

* cited by examiner

ORGANIC LIGHT EMITTING DISPLAY APPARATUS

BACKGROUND

1. Field

Embodiments relate to an organic light emitting display apparatus.

2. Description of the Related Art

Organic light emitting display apparatuses, which use an organic material for an emission layer, may afford high brightness, a low driving voltage, and a high response speed, and may be used to produce various colors of light. A touch screen function may be desirable for organic light emitting display apparatuses in order to provide a more convenient graphic user interface (GUI). The touch screen function may be provided using, e.g., an electrostatic capacitor, a resistance film, an infrared light sensor, an ultrasonic wave, a piezo effect, an electromagnetic sensor, or an optical sensor. Where the touch screen function is provided using an electrostatic capacitor, when a finger, a conductive object, or a high-dielectric object approaches or contacts an electrode for sensing a touch, an electrostatic capacity (capacitor) may be generated between the finger, etc., and the electrode, and a location where the electrostatic capacity changes is thereby sensed.

SUMMARY

Embodiments are therefore directed to an organic light emitting display apparatus, which substantially overcomes one or more problems arising from limitations and disadvantages of the related art.

It is therefore a feature of an embodiment to provide an organic light emitting display apparatus having a touch panel function obtained without an increase in thickness and having a simple and inexpensive manufacturing process.

At least one of the above and other features and advantages may be realized by providing an organic light emitting display apparatus, including a substrate, a first touch sensing electrode layer on the substrate, a first protective layer on the substrate, the first protective layer covering the first touch sensing electrode layer, a ground layer on the first protective layer, the ground layer being electrically grounded, an insulating layer on the ground layer, and an organic light emitting device on the insulating layer.

The organic light emitting device may emit light toward the substrate.

The first touch sensing electrode layer may include a plurality of separated patterns.

The first touch sensing electrode layer may include an optically transparent material.

The optically transparent material may include at least one of ITO, IZO, ZnO, and $In_2O_3$.

The ground layer may include an optically transparent material.

The optically transparent material may include at least one of ITO, IZO, ZnO, and $In_2O_3$.

The first protective layer may include an inorganic insulating material.

The organic light emitting display apparatus may further include a second touch sensing electrode layer between the first protective layer and the ground layer, and a second protective layer between the second touch sensing electrode layer and the ground layer.

The second touch sensing electrode layer may include an optically transparent material.

The optically transparent material may include at least one of ITO, IZO, ZnO, and $In_2O_3$.

The second protective layer may include an inorganic insulating material.

The organic light emitting display apparatus may further include a plurality of thin film transistors on the insulating layer. A plurality of the organic light emitting devices may be on the insulating layer, each of the organic light emitting devices including a first electrode electrically connected to a corresponding thin film transistor, a second electrode on the first electrode, and an organic emission layer between the first electrode and the second electrode.

The substrate may include a transparent glass material.

Each of the ground layer and the first touch sensing electrode layer may include an optically transparent material.

Each of the thin film transistors may include an active layer having a channel region, a source region, and a drain region, a gate electrode corresponding to the channel region, and source and drain electrodes connected to the source and drain regions. The first electrode of the organic light emitting device and the gate electrode may include a same material and may be formed on the same layer.

The first electrode and the gate electrode may each include an optically transparent material.

Each of the thin film transistors may include an active layer having a channel region, a source region, and a drain region, a gate electrode corresponding to the channel region, and source and drain electrodes connected to the source and drain regions. The first electrode of the organic light emitting device and the source and drain electrodes may include a same material and may be formed on the same layer.

The first electrode, the source electrode, and the drain electrode may each include an optically transparent material.

The optically transparent material may include at least one of ITO, IZO, ZnO, and $In_2O_3$.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
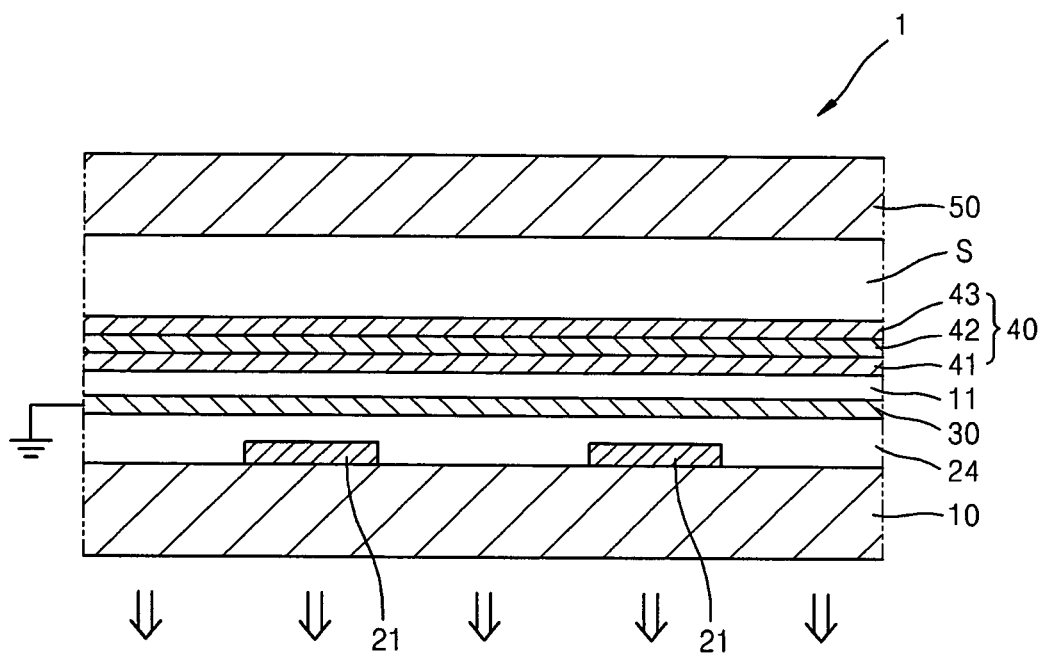
FIG. 1 illustrates a schematic cross-sectional view of a portion of an organic light emitting display apparatus according to an embodiment.

Korean Patent Application No. 10-2009-0082565, filed on Sep. 2, 2009, in the Korean Intellectual Property Office, and entitled: "Organic Light Emitting Display Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

An example embodiment relates to an electrostatic capacitive-type organic light emitting display apparatus having a touch panel function.

FIG. 1 illustrates a schematic cross-sectional view of a portion of an organic light emitting display apparatus 1 according to an embodiment. The organic light emitting display apparatus 1 is a bottom emission-type organic light emitting display apparatus in which an image is formed toward a substrate 10.

Referring to FIG. 1, the organic light emitting display apparatus 1 according to the present embodiment may include the substrate 10, a first touch sensing electrode layer 21, a protective layer 24, an organic light emitting device 40, and an encapsulation member 50. The first touch sensing electrode layer 21, the protective layer 24, the organic light emitting device 40, and the encapsulation member 50 may be sequentially formed in the stated order on the substrate 10. The substrate 10 may include a transparent material. The substrate 10 may be formed of a transparent glass material including $SiO_2$ as a major component. Although not illustrated in FIG. 1, a buffer layer (not shown) may be further formed on the substrate 10 so as to flatten the substrate 10 and prevent permeation of impurities. The organic light emitting device 40 may be an organic light emitting diode (OLED).

The first touch sensing electrode layer 21 may be formed on the substrate 10. The first touch sensing electrode layer 21 may include an optically transparent material, e.g., ITO (indium tin oxide), IZO (indium zinc oxide), ZnO, and/or $In_2O_3$.

The optically transparent material may be deposited or spin coated on the substrate 10 and then a photolithography process may be performed thereon, thereby forming the first touch sensing electrode layer 21. The first touch sensing electrode layer 21 may include a plurality of electrode patterns that are separated from each other. Alternatively, the plurality of separated electrode patterns may be directly formed on the substrate 10 by, for example, inkjet printing.

As discussed above, the organic light emitting display apparatus 1 is a bottom emission-type organic light emitting display apparatus, in which an image is formed toward the substrate 10. Further, as described above, since the first touch sensing electrode layer 21 according to the present embodiment may be formed on the flat substrate 10, the first touch sensing electrode layer 21 may be easily patterned. In contrast, for a top emission-type organic light emitting display apparatus, a touch sensing electrode layer is patterned on an encapsulation substrate having recesses formed by etching, a more complex and potentially less accurate process.

A connection portion (not shown) of the first touch sensing electrode layer 21 may be electrically connected to a data line (not shown) that transfers a signal to the organic light emitting device 40. The connection portion may be formed on the substrate 10. The connection portion of the first touch sensing electrode layer 21 and the first touch sensing electrode layer 21 itself may be simultaneously formed on the substrate 10.

In the case of a top emission-type organic light emitting display apparatus, since a connection portion of a touch sensing electrode layer formed on an encapsulation substrate needs to be connected to a data line formed on a lower substrate, a conductive member is further used to connect the connection portion of the touch sensing electrode layer to the data line. Furthermore, in a top emission-type organic light emitting display apparatus, the encapsulation substrate and the lower substrate may be manufactured separately, and it may be difficult to combine the encapsulation substrate with the lower substrate. In contrast, according to the present embodiment, since the connection portion of the first touch sensing electrode layer 21 may be formed on the substrate 10, a conductive member for the connection may be omitted and the combining process may be more easily performed.

Referring again to FIG. 1, when a pointing object, e.g., a finger, a conductive object, or a high-dielectric object, approaches or contacts a surface of the substrate 10 on which the first touch sensing electrode layer 21 is formed, an electrostatic capacity between the first touch sensing electrode layer 21 and the pointing object is applied to a touch sensing circuit due to the approach and contact. Thus, where a change in the electrostatic capacity is sensed, the pointing location is sensed.

The first touch sensing electrode layer 21 may be formed on a portion of a display region in which an image is formed, or on the entire display region of the substrate 10. In addition, the size of the first touch sensing electrode layer 21 and the interval between adjacent first touch sensing electrode layers 21 may vary.

The protective layer 24 may be formed on the substrate 10 to cover the first touch sensing electrode layer 21. The protective layer 24 may be formed of, e.g., an inorganic insulating material.

A ground layer 30 may be formed on the surface of the protective layer 24. The ground layer 30 may be formed on the entire surface of the protective layer 24. The ground layer 30 may include an optically transparent material, e.g., ITO, IZO, ZnO, and/or $In_2O_3$. The ground layer 30 may be electrically grounded, and thus, signal disturbance between an image signal (to form an image by the organic light emitting device 40) and a touch sensing signal (generated by the first touch sensing electrode layer 21) may be prevented.

A first insulating layer 11 may be formed on the ground layer 30, and the organic light emitting device 40 may be formed on the first insulating layer 11.

The organic light emitting device 40 may include a first electrode layer 41, a second electrode layer 43 that faces the first electrode layer 41, and an organic emission layer 42 interposed between the first electrode layer 41 and the second electrode layer 43.

The first electrode layer 41 may include a transparent conductive material, e.g., ITO, IZO, $In_2O_3$, and/or ZnO, and may be formed in a predetermined pattern by photolithography.

For passive matrix (PM) display apparatuses, the first electrode layer 41 may be formed in a strip pattern in which lines are separated from each other. For active matrix (AM) display apparatuses, the first electrode layer 41 may be formed such that each of the first electrode layers 41 corresponds to a respective pixel. For AM display apparatuses, a thin film transistor (TFT) layer including at least one TFT may be further formed under the first electrode layer 41, and the first electrode layer 41 may be electrically connected to the TFT layer. The first electrode layer 41 may be transparent. The first electrode layer 41 may be connected to a first external terminal (not shown) and may function as an anode for the OLED.

The second electrode layer 43 may be located above the first electrode layer 41. The second electrode layer 43 may be a reflective electrode formed of, e.g., aluminum, silver, and/or potassium. The second electrode layer 43 may be connected to a second external terminal (not shown) and may function as a cathode for the OLED.

For PM display apparatuses, the second electrode layer 43 may be formed in a stripe pattern that is perpendicular to the stripe pattern of the first electrode layer 41.

Polarities of the first electrode layer 41 and the second electrode layer 43 may be alternated.

The organic emission layer 42 may be interposed between the first electrode layer 41 and the second electrode layer 43. The organic emission layer 42 emits light as a result of being electrically driven by the first electrode layer 41 and the second electrode layer 43. The organic emission layer 42 may be formed of a small molecule organic material, a polymer organic material, etc.

If the organic emission layer 42 is formed of a low molecular weight organic material, i.e., a small molecule organic material, a hole transport layer (HTL), a hole injection layer (HIL), etc., may be sequentially formed in a direction from the organic emission layer 42 to the first electrode layer 41, and an electron transport layer (ETL), an electron injection layer (EIL), etc., may be sequentially formed in a direction from the organic emission layer 42 to the second electrode layer 43. Various layers, in addition to the HIL, HTL, ETL, and EIL, may be further formed. Layers may be formed using an organic material such as copper phthalocyanine (CuPc), N,N'-di(naphthalene-1-yl)-N,N'-diphenyl-benzidine (NPB), or tris-8-hydroxyquinoline aluminum (Alq3).

If the organic emission layer 42 is formed of a polymer organic material, only the HTL may be formed between the organic emission layer 42 and the first electrode layer 41. The HTL may be formed on the first electrode layer 41 by, e.g., inkjet printing or spin coating poly-(2,4)-ethylene-dihydroxy thiophene (PEDOT) or polyaniline (PANI). Polymer organic materials for the organic emission layer 42 may include, e.g., poly-phenylenevinylene (PPV)-based polymer organic materials and polyfluorene-based polymer organic materials. The organic emission layer 42 may be formed in a color pattern using, e.g., an inkjet printing method, a spin coating and patterning method, or a thermal transferring method using a laser.

The encapsulation member 50 may be formed on the organic light emitting device 40 in order to seal the organic light emitting device 40 from the outside and prevent permeation of humidity or oxygen. The encapsulation member 50 may include glass or a metal cap. The encapsulation member 50 may be combined with the organic light emitting device 40 using a sealant (not shown). The sealant may be a sealing glass frit, an organic sealant, an inorganic sealant, or an organic/inorganic complex sealant.

According to the embodiment described above, a touch sensing electrode layer may be directly patterned on a substrate. Thus, a touch panel function may be obtained without an increase in thickness, the manufacturing process may be simplified, and manufacturing costs may be reduced.

A filling material (not shown) and/or an absorbent material (not shown) may be further formed in the space S between the organic light emitting device 40 and the encapsulation member 50. The filling material (not shown) can protect the organic light emitting display apparatus 1 from an impact of outside, and the absorbent material (not shown) can absorb the moisture.

Figure 2:
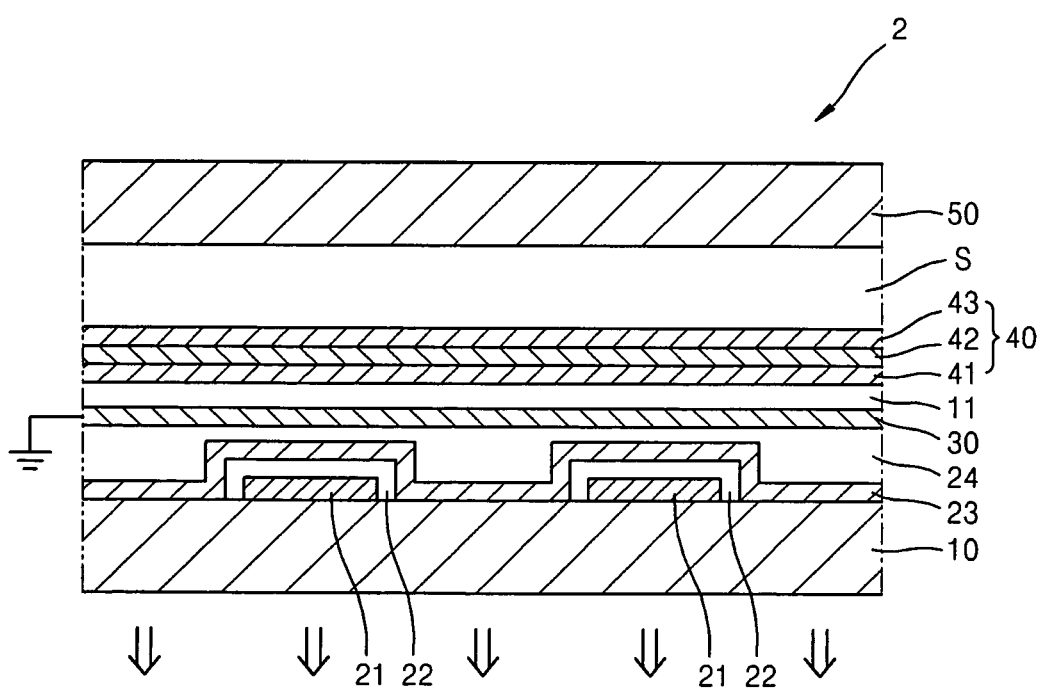
FIG. 2 illustrates a schematic cross-sectional view of a portion of an organic light emitting display apparatus according to another embodiment.

FIG. 2 illustrates a schematic cross-sectional view of a portion of an organic light emitting display apparatus 2 according to another embodiment.

Referring to FIG. 2, the organic light emitting display apparatus 2 may include the substrate 10, the first touch sensing electrode layer 21, a first protective layer 22, a second touch sensing electrode layer 23, the protective layer 24 ("second protective layer"), the organic light emitting device 40, and the encapsulation member 50. The first touch sensing electrode layer 21, the first protective layer 22, the second touch sensing electrode layer 23, the second protective layer 24, the organic light emitting device 40, and the encapsulation member 50 may be sequentially formed in the stated order on the substrate 10. The substrate 10 may be formed of a transparent material.

As compared to the organic light emitting display apparatus 1, the organic light emitting display apparatus 2 may include the second touch sensing electrode layer 23 between the first protective layer 22 and the ground layer 30, and may include the second protective layer 24 between the second touch sensing electrode layer 23 and the ground layer 30.

The second touch sensing electrode layer 23 may include an optically transparent material, e.g., ITO, IZO, ZnO, and/or $In_2O_3$.

The first protective layer 22 may cover the corresponding first touch sensing electrode layer 21, and may electrically insulate the first touch sensing electrode layer 21 from the second touch sensing electrode layer 23. The second protective layer 24 may cover the second touch sensing electrode layer 23. The second protective layer 24 may cover the entire second touch sensing electrode layer 23. The second protective layer 24 may electrically insulate the first and second touch electrode sensing layers 21 and 23 from the ground layer 30. The first protective layer 22 may be formed of an inorganic insulating material. The second protective layer 24 may be formed of an inorganic insulating material.

The second touch sensing electrode layer 23 may be formed as a common layer, i.e., common to a plurality of the first touch sensing electrode layers 21. A constant voltage may be applied to the second touch sensing electrode layer 23. Thus, the first touch sensing electrode layer 21 and the second touch sensing electrode layer 23 may act together as a single capacitor, and an electrostatic capacity between the first touch sensing electrode layer 21 and the second touch sensing electrode layer 23 may be maintained constant until disturbed. For example, when a pointing object such as a finger, a conductive object or a high-dielectric object approaches or contacts a surface of the substrate 10 of the organic light emitting display apparatus 2, the first touch sensing electrode layer 21 and the pointing object may form a second capacitor. Thus, overall, two capacitors may be connected in series, and the entire electrostatic capacity may be changed. When a change in the electrostatic capacity is sensed, a pointing position is sensed.

The ground layer 30 may be formed on the surface of the second protective layer 24. The ground layer 30 may be formed on the entire surface of the second protective layer 24. The ground layer 30 may include an optically transparent material, e.g., ITO, IZO, ZnO, and/or $In_2O_3$. The ground layer 30 may be electrically grounded, and thus, a signal disturbance between an image signal (to form an image by the organic light emitting device 40) and a touch sensing signal (generated by the first and second touch sensing electrode layers 21 and 23) may be prevented. The organic light emitting device 40 and the encapsulation member 50 may be the same as those described above in connection with the organic light emitting display apparatus 1 of the previous embodiment.

In the organic light emitting display apparatus 2 according to the present embodiment, the first and second touch sensing electrode layers 21 and 23 may be formed on a flat surface, i.e., the substrate 10, where as the conventional top emitting structure requires the touch sensing electrodes to be formed on the encapsulation member. Unevenness of the encapsulation member makes patterning, e.g., photolithography, more difficult, whereas the first and second touch sensing electrode layers 21 and 23 may be more easily patterned in the present bottom emission-type organic light emitting display apparatus 2.

Connection portions (not shown) of at least one of the first and second touch sensing electrodes layers 21 and 23 may be formed on the substrate 10 and electrically connected to data lines (not shown) that transfer a signal to the organic light emitting device 40. The connection portions and the first and second touch sensing electrode layers 21 and 23 may be simultaneously formed on the substrate 10. Thus, as in the organic light emitting display apparatus 1 of the previous embodiment, a conductive member for connecting a connection portion of a touch sensing electrode layer to a data line may be omitted in the organic light emitting display apparatus 2 of the present embodiment, and the connection portion may be more easily connected to a data line than in a top emission-type organic light emitting display apparatus.

Hereinafter, organic light emitting display apparatuses according to other embodiments will be described with reference to FIGS. 3 through 8, focusing on their differences from the previous embodiments.

Figure 3:
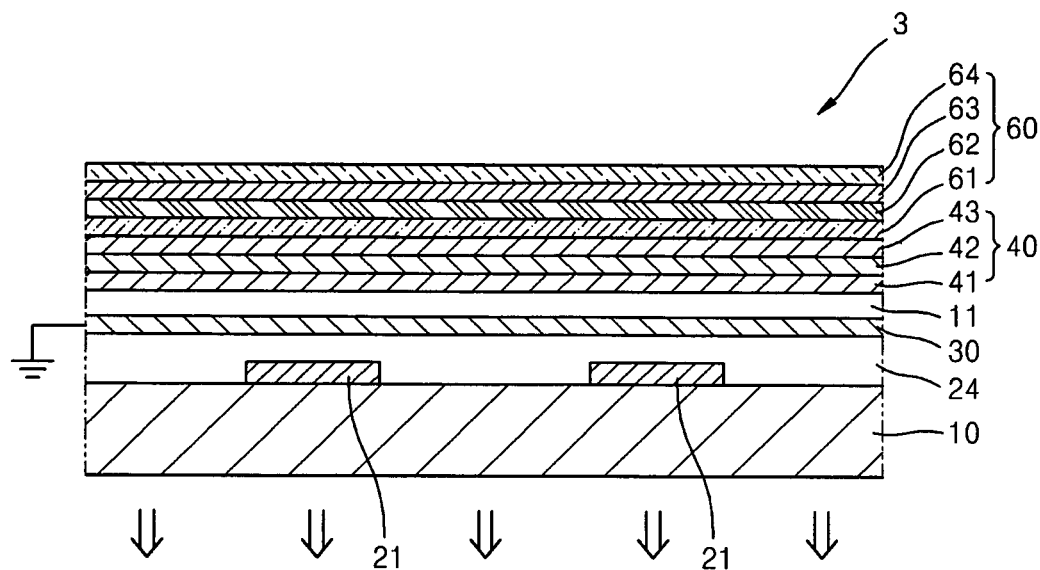
FIG. 3 illustrates a schematic cross-sectional view of a portion of an organic light emitting display apparatus according to another embodiment, in which an apparatus similar to that illustrated in FIG. 1 is provided with an encapsulation member that includes a plurality of thin films.

FIG. 3 illustrates a schematic cross-sectional view of a portion of an organic light emitting display apparatus 3 according to another embodiment, in which an apparatus similar to that illustrated in FIG. 1 is provided with an encapsulation member that includes a plurality of thin films.

Referring to FIG. 3, the organic light emitting display apparatus 3 according to the present embodiment may include the substrate 10, the first touch sensing electrode layer 21, the protective layer 24, the organic light emitting device 40, and an encapsulation member 60. The encapsulation member may include a plurality of thin films 61, 62, 63, and 64. The first touch sensing electrode layer 21, the protective layer 24, the organic light emitting device 40, and the encapsulation member 60 may be sequentially formed in the stated order on the substrate 10. The substrate 10 may be formed of a transparent material.

The organic light emitting display apparatus 3 of the present embodiment is different from the organic light emitting display apparatus 1 of the first previous embodiment in the structure of the encapsulation member 60. In the organic light emitting display apparatus 1 of the first previous embodiment, the encapsulation member 50 may be separate from the organic light emitting device 40 and combined with the substrate 10 using a sealant (not shown), whereas, in the organic light emitting display apparatus 3 of the present embodiment, the encapsulation member 60 may be formed by forming the plurality of thin films 61, 62, 63, and 64 directly on the organic light emitting device 40.

The plurality of thin films 61, 62, 63, and 64 may be formed by alternately depositing organic and inorganic films. If only an organic film is used, humidity or oxygen may permeate through fine pores of the organic film, and if only an inorganic film is used, a desired thickness may not be obtained. Although FIG. 3 illustrates four thin films, the number or deposition sequence of thin films may vary. The thin films are preferably alternately deposited.

For a top emission-type organic light emitting display apparatus, a touch sensing electrode layer is formed on an encapsulation member toward which an image is formed. In this case, the encapsulation member functions as both a dielectric layer for generating an electrostatic capacity between a pointing object such as a finger, etc., and the touch sensing electrode layer, and as a support layer for protecting the touch sensing electrode layer from the pointing object. Thus, the top emission-type organic light emitting display apparatus cannot use an alternately deposited-thin film structure such as the encapsulation member 60 of the organic light emitting display apparatus 3 of the present embodiment. In contrast, the organic light emitting display apparatus 3 of the present embodiment is a bottom emission-type organic light emitting display apparatus and the first touch sensing electrode layer 21 may be formed on the substrate 10. Thus, the encapsulation structure of the encapsulation member 60 may be more freely designed. Thus, a thin film-type encapsulation structure as illustrated in FIG. 3 can be employed. Further, the entire thickness of an organic light emitting display apparatus may be reduced.

Figure 4:
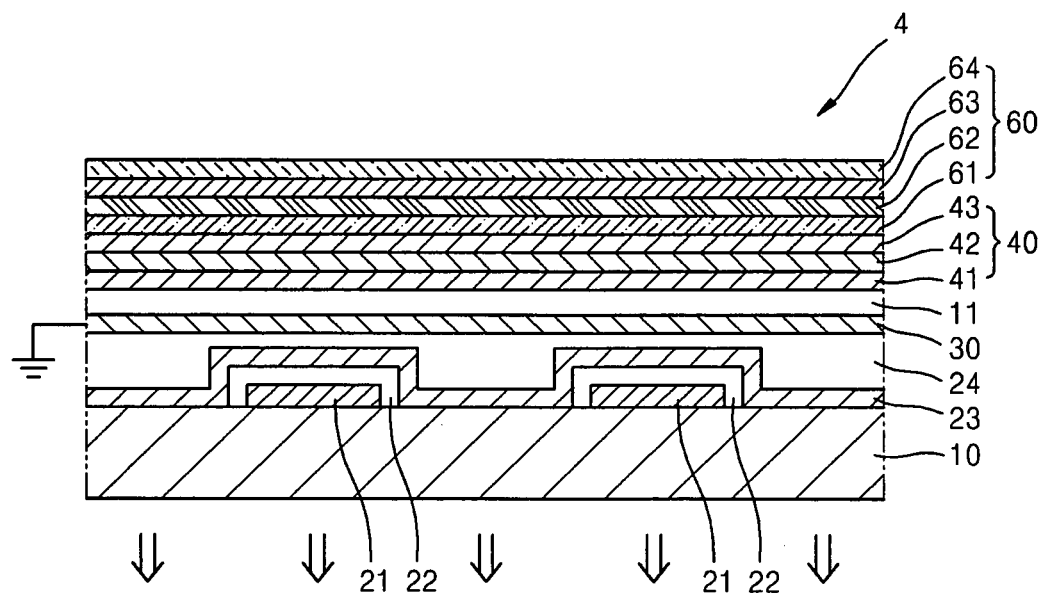
FIG. 4 illustrates a schematic cross-sectional view of a portion of an organic light emitting display apparatus according to another embodiment, in which an apparatus similar to that illustrated in FIG. 2 is provided with an encapsulation member that includes a plurality of thin films.

FIG. 4 illustrates a schematic cross-sectional view of a portion of an organic light emitting display apparatus 4 according to another embodiment, in which an apparatus similar to that illustrated in FIG. 2 is provided with an encapsulation member that includes a plurality of thin films.

Referring to FIG. 4, the organic light emitting display apparatus 4 according to the present embodiment is a bottom emission-type organic light emitting display apparatus. The organic light emitting display apparatus 4 may include the substrate 10, the first touch sensing electrode layer 21, the first protective layer 22, the second touch sensing electrode layer 23, the second protective layer 24, the organic light emitting device 40, and the encapsulation member 60. The encapsulation member 60 may include the plurality of thin films 61, 62, 63, and 64. The first touch sensing electrode layer 21, the first protective layer 22, the second touch sensing electrode layer 23, the second protective layer 24, the organic light emitting device 40, and the encapsulation member 60 may be sequentially formed in the stated order on the substrate 10. The substrate 10 may be formed of a transparent material Like in the organic light emitting display apparatus 2 of the second previous embodiment, the organic light emitting display apparatus 4 of the present embodiment may include the second touch sensing electrode layer 23 between the first protective layer 22 and the ground layer 30, and the second protective layer 24 between the second touch sensing electrode layer 23 and the ground layer 30. Also, like in the organic light emitting display apparatus 3 of the third previous embodiment, the plurality of thin films 61, 62, 63, and 64 may be formed by alternately depositing organic and inorganic films directly on the organic light emitting device 40.

Figure 5:
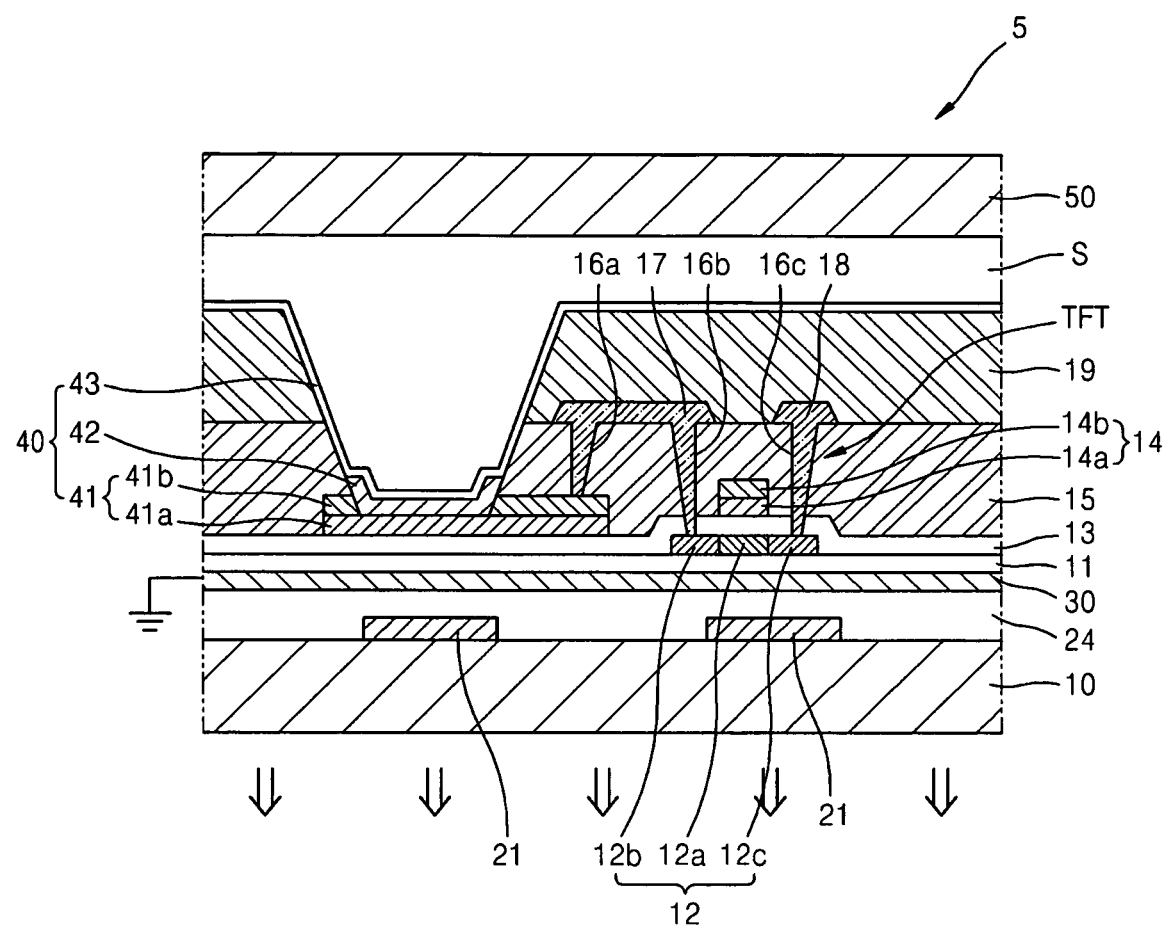
FIG. 5 illustrates a schematic cross-sectional view of a portion of an organic light emitting display apparatus according to another embodiment.

FIG. 5 illustrates a schematic cross-sectional view of a portion of an organic light emitting display apparatus 5 according to another embodiment.

Referring to FIG. 5, the organic light emitting display apparatus 5 according to the present embodiment may include the substrate 10, the first touch sensing electrode layer 21, the protective layer 24, a plurality of TFTs, the organic light emitting device 40, and the encapsulation member 50. The first touch sensing electrode layer 21, the protective layer 24, the TFTs, the organic light emitting device 40, and the encapsulation member 50 may be sequentially formed in the stated order on the substrate 10. The substrate 10 may be formed of a transparent material.

The organic light emitting display apparatus 5 according to the present embodiment is an active matrix (AM) bottom emission-type organic light emitting display apparatus. A first electrode layer 41 of the organic light emitting device 40 may be electrically connected to a TFT of the plurality of TFTs. This structure will now be described in detail below.

Like in the organic light emitting display apparatus 1 of the first previous embodiment, the first touch sensing electrode layer 21, the protective layer 24, the ground layer 30, and the first insulating layer 11 may be formed on the substrate 10 that is transparent.

An active layer 12 including a channel region 12a and source and drain regions 12b and 12c may be formed on the first insulating layer 11. The active layer 12 may include polycrystalline silicon prepared by crystallizing amorphous silicon. The source and drain regions 12b and 12c may each include polycrystalline silicon and may each be doped with an impurity such as N+ or P+.

A second insulating layer 13 that constitutes a gate insulating layer may be formed on the active layer 12. A gate electrode 14 and the first electrode layer 41 may be simultaneously formed on the second insulating layer 13. For example, first conductive layers 14a and 41a, each including an optically transparent material such as ITO, IZO, ZnO, and/or $In_2O_3$, and second conductive layers 14b and 41b, each including a material such as Ag, Mg, Al, Pt, Pd, Au, Ni, Nd, Ir, Cr, Li, Ca, Mo, Ti, W, MoW, and/or Al/Cu, may be sequentially formed on the first insulating layer 13. Then, the first and second conductive layers 14a and 41a and the second conductive layers 14b and 41b may be simultaneously patterned into the first electrode layer 41 and the gate electrode 14.

A third insulating layer 15 having a predetermined thickness may be formed on the gate electrode 14 and the first electrode layer 41. The third insulating layer 15 may serve as an inter-insulating layer. The third insulating layer 15 may be formed by, e.g., depositing an organic material or alternately depositing organic/inorganic materials on the second insulating layer 13. After the third insulating layer 15 is formed, a halftone mask may be used to form contact holes 16a, 16b, and 16c. The contact holes 16a, 16b, and 16c may expose portions of the source and drain regions 12b and 12c and a portion of the second conductive layer 41b of the first electrode layer 41.

After the contact holes 16a, 16b, and 16c are formed, a conductive layer contacting the source and drain regions 12b and 12c, and the second conductive layer 41b of the first electrode layer 41 may be formed on the third insulating layer 15. The conductive layer may then be patterned into source and drain electrodes 17 and 18. One of the source and drain electrodes 17 and 18 may contact the second conductive layer 41b of the first electrode layer 41 through the contact hole 16a.

After the source and drain electrodes 17 and 18 are formed, a fourth insulating layer may be formed on the third insulating layer 15. Then, a pixel defining layer (PDL) 19 may be formed such that the PDL 19 exposes the first conductive layer 41a of the first electrode layer 41.

Then, an organic emission layer 42, and a second electrode layer 43 as a common electrode, may be formed on the first electrode layer 41. The second electrode layer 43 may be a reflective electrode, such that light emitted from the organic emission layer 42 is directed towards the substrate 10.

To prevent permeation of external humidity or oxygen into the organic light emitting device 40, the encapsulation member 50 for sealing the organic light emitting device 40 from the outside may be further disposed on the organic light emitting device 40. The encapsulation member 50 may include, e.g., a glass or metal cap.

In the organic light emitting display apparatus 5 of the present embodiment described above, the first electrode layer 41 of the organic light emitting device 40 and the gate electrode 14 may be formed of the same material. Further, a transparent layer of the first electrode layer 41, i.e., the first conductive layer 41a may be exposed, and the first electrode layer 41 and the gate electrode 14 may be formed on the second insulating layer 13. Thus, the number of masks used to manufacture a TFT may be reduced. Further, an aperture ratio of the OLED may be increased. Thus, the organic light emitting display apparatus 5 according to the present embodiment provide for bottom emission by the organic light emitting device 40.

The above embodiment is not limited to structures of the TFT and the first electrode layer 41 illustrated in FIG. 5. For example, the apparatus may also have other structures wherein the first electrode layer 41 and the gate electrode 14 are formed of the same material, the first electrode layer 41 includes a transparent material, and the first electrode layer 41 and the gate electrode 14 are formed on the same layer.

Figure 6:
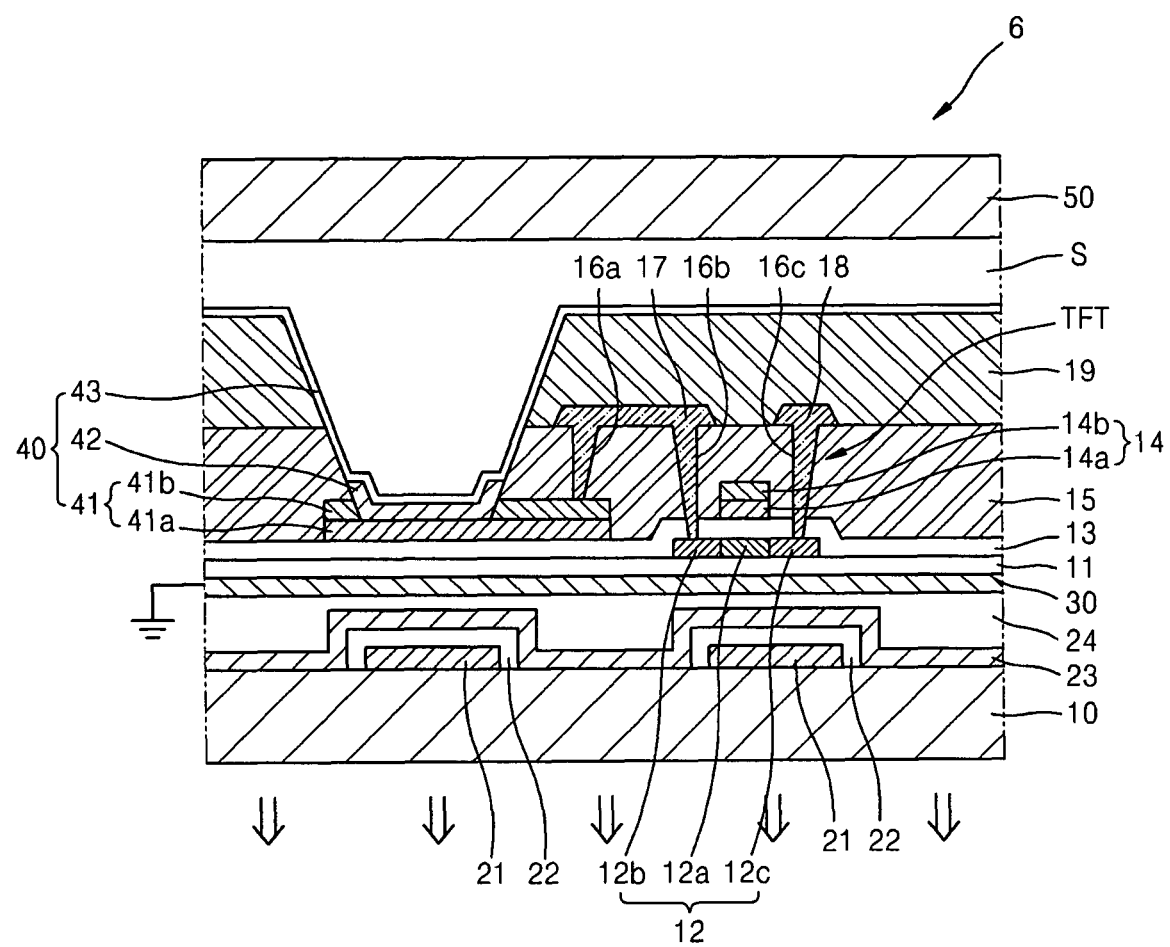
FIG. 6 illustrates a schematic cross-sectional view of a portion of an organic light emitting display apparatus according to another embodiment.

FIG. 6 illustrates a schematic cross-sectional view of a portion of an organic light emitting display apparatus 6 according to another embodiment.

Referring to FIG. 6, the organic light emitting display apparatus 6 is a bottom emission-type organic light emitting display apparatus. The organic light emitting display apparatus 6 may include the substrate 10, the first touch sensing electrode layer 21, the first protective layer 22, the second touch sensing electrode layer 23, the second protective layer 24, the plurality of TFTs, the organic light emitting device 40, and the encapsulation member 50. The first touch sensing electrode layer 21, the first protective layer 22, the second touch sensing electrode layer 23, the second protective layer 24, the plurality of TFTs, the organic light emitting device 40, and the encapsulation member 50 may be sequentially formed in the stated order on the substrate 10. The substrate 10 may be formed of a transparent material.

Like in the organic light emitting display apparatus 2 of the second previous embodiment, the organic light emitting display apparatus 6 of the present embodiment may include the second touch sensing electrode layer 23 between the first protective layer 22 and the ground layer 30, and the second protective layer 24 between the second touch sensing electrode layer 23 and the ground layer 30. In addition, like in the organic light emitting display apparatus 5 of the fifth previous embodiment, the first electrode layer 41 of the organic light emitting device 40 and the gate electrode 14 may be formed of the same material, a transparent layer of the first electrode layer 41, i.e., the first conductive layer 41a may be exposed, and the first electrode layer 41 and the gate electrode 14 may be formed on the second insulating layer 13.

Figure 7:
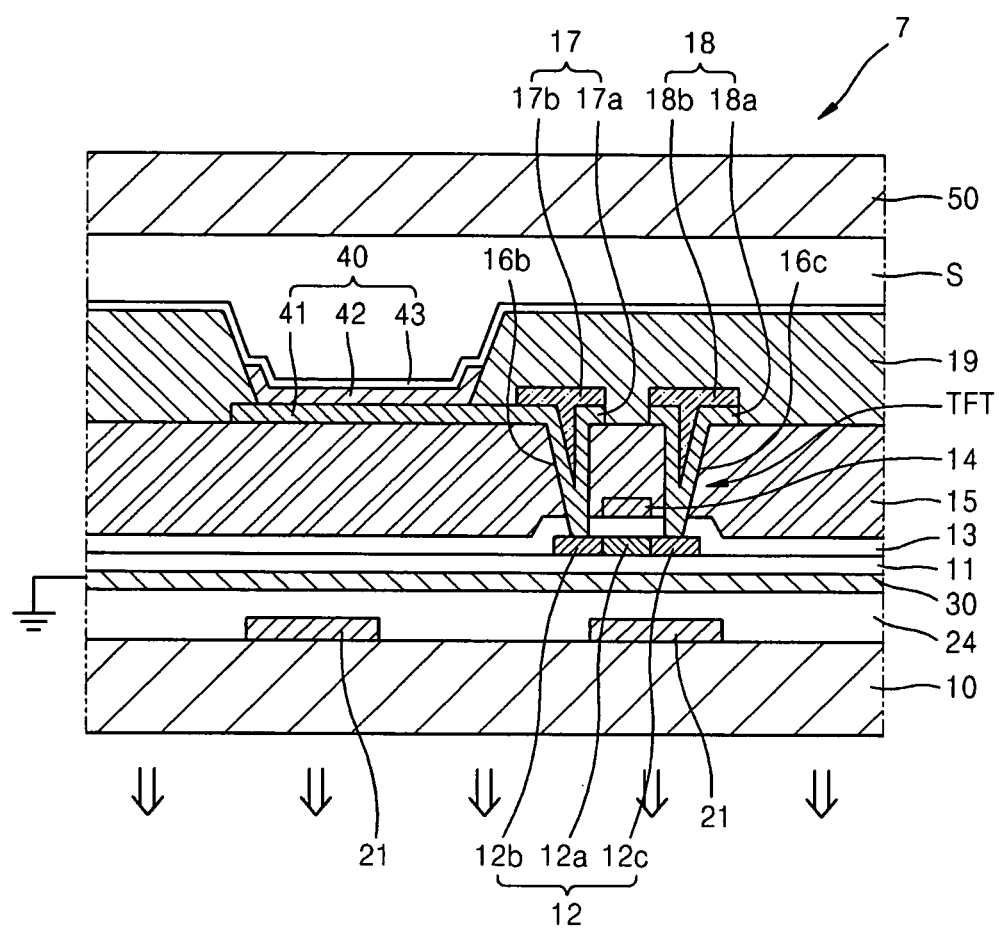
FIG. 7 illustrates a schematic cross-sectional view of a portion of an organic light emitting display apparatus according to another embodiment.

FIG. 7 illustrates a schematic cross-sectional view of a portion of an organic light emitting display apparatus 7 according to another embodiment.

Referring to FIG. 7, the organic light emitting display apparatus 7 according to the present embodiment may include the substrate 10, the first touch sensing electrode layer 21, the protective layer 24, the plurality of TFTs, the organic light emitting device 40, and the encapsulation member 50. The first touch sensing electrode layer 21, the protective layer 24, the plurality of TFTs, the organic light emitting device 40, and the encapsulation member 50 may be sequentially formed in the stated order on the substrate 10. The substrate 10 may be formed of a transparent material.

Like in the organic light emitting display apparatus 5 of fifth previous embodiment, the first touch sensing electrode layer 21, the protective layer 24, the ground layer 30, the first insulating layer 11, and the active layer 12 may be formed on the substrate 10.

The active layer 12 may include polycrystalline silicon prepared by crystallizing amorphous silicon. The active layer 12 may include the source and drain regions 12b and 12c, which may each include polycrystalline silicon and be doped with an impurity such as N+ or P+.

The second insulating layer 13, serving as a gate insulating layer, may be formed on the active layer 12. The gate electrode 14 may be formed on the second insulating layer 13.

After the gate electrode 14 is formed, the third insulating layer 15, which may have a predetermined thickness and serve as an inter-insulating layer, may be formed by, e.g., depositing an organic material or alternately depositing organic/inorganic materials on the second insulating layer 13. After the third insulating layer 15 is formed, the contact holes 16b and 16c, respectively exposing the source and drain regions 12b and 12c of the active layer 12, may be formed in the third insulating layer 15 and the second insulating layer 13 using a mask.

After the contact holes 16b and 16c are formed, the source and drain electrodes 17 and 18 and the first electrode layer 41 may be simultaneously formed. For example, the first conductive layers 17a, 18a, and 41, each including as an optically transparent material ITO, IZO, ZnO, and/or $In_2O_3$, and the second conductive layers 17b and 18b, each including, e.g., Ag, Mg, Al, Pt, Pd, Au, Ni, Nd, Ir, Cr, Li, Ca, Mo, Ti, W, MoW, and/or Al/Cu, may be sequentially deposited on the third insulating layer 15 and then simultaneously patterned using a halftone mask to form the source and drain electrodes 17 and 18 and the first electrode layer 41. In another implementation, the first conductive layer 41, as a transparent electrode, may be combined with the second conductive layers 17b and 18b, and the first conductive layers 17a, 18a may be omitted.

After the source and drain electrodes 17 and 18 are formed, a fourth insulating layer (not shown) may be formed on the third insulating layer 15, and then the pixel defining layer (PDL) 19, exposing a portion of the first electrode layer 41a, may be formed. Then, the organic emission layer 42, the second electrode layer 43, and the encapsulation member 50 may be formed.

In the organic light emitting display apparatus 5 of the present embodiment as described above, the first electrode layer 41 of the organic light emitting device 40 and the first conductive layers 17a and 18a of the source and drain electrode 17 and 18 may be formed of the same material. Further, the first electrode layer 41 may be a transparent layer, and the first electrode layer 41 and the source and drain electrodes 17 and 18 may be formed on the second insulating layer 13. Thus, the number of masks used to manufacture the TFT may be reduced and the aperture ratio may be increased. The organic light emitting display apparatus 7 according to the present embodiment may be a bottom emission apparatus.

The structure of the TFT and the first electrode layer 41 of the organic light emitting display apparatus 7 of the present embodiment are not limited to the structures illustrated in FIG. 7. For example, the apparatus may also have other structures wherein the first electrode layer 41 and the source and drain electrodes 17 and 18 are formed of the same material, the first electrode layer 41 includes a transparent material, and the first electrode layer 41 and the source and drain electrodes 17 and 18 are formed on the same layer.

Figure 8:
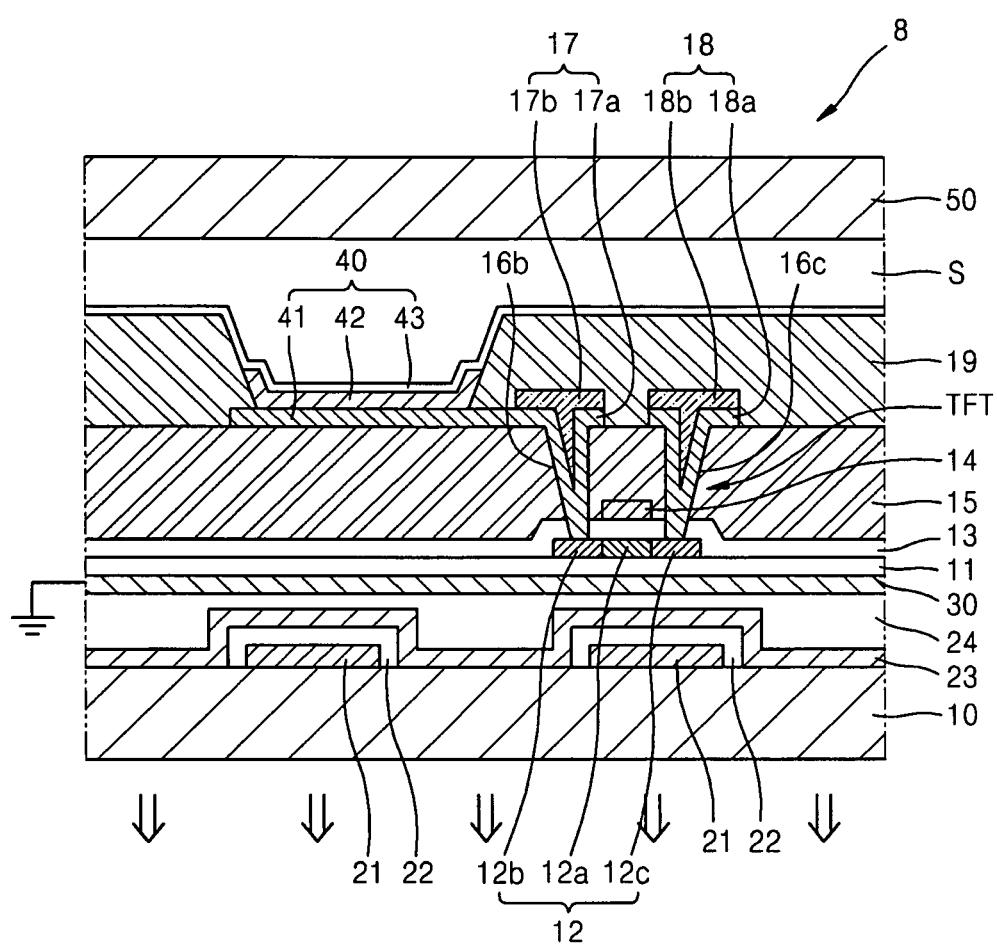
FIG. 8 illustrates a schematic cross-sectional view of a portion of an organic light emitting display apparatus according to another embodiment.

FIG. 8 illustrates a schematic cross-sectional view of a portion of an organic light emitting display apparatus 8 according to another embodiment.

Referring to FIG. 8, the organic light emitting display apparatus 8 according to the present embodiment is a bottom emission-type organic light emitting display apparatus. The organic light emitting display apparatus 8 may include the substrate 10, the first touch sensing electrode layer 21, the first protective layer 22, the second touch sensing electrode layer 23, the second protective layer 24, the plurality of TFTs, the organic light emitting device 40, and the encapsulation member 50. The first touch sensing electrode layer 21, the first protective layer 22, the second touch sensing electrode layer 23, the second protective layer 24, the plurality of TFTs, the organic light emitting device 40, and the encapsulation member 50 may be sequentially formed in the stated order on the substrate 10. The substrate 10 may include a transparent material As in the organic light emitting display apparatus 2, the organic light emitting display apparatus 8 of the present embodiment may include the second touch sensing electrode layer 23 between the first protective layer 22 and the ground layer 30, and the second protective layer 24 between the second touch sensing electrode layer 23 and the ground layer 30. In addition, like in the organic light emitting display apparatus 7 of the seventh previous embodiment, the first electrode layer 41 of the organic light emitting device 40 and source and drain electrodes 17 and 18 may be formed of the same material, the first electrode layer 41 may be a transparent layer, and the first electrode layer 41 and the source and drain electrodes 17 and 18 may be formed on the second insulating layer 13.

In other embodiments, which may be appreciated in view of the above-described apparatuses and the corresponding illustrations in FIGS. 5 through 8, structures analogous to those shown in FIGS. 7 and 8 may be formed using the above described encapsulation members 60, such that the organic light emitting display apparatuses 5, 6, 7, and 8 may each include organic and inorganic films alternately deposited directly on an upper surface of the organic light emitting device 40.

As described above, a touch panel function may be obtained without an increase in thickness, the manufacturing process may be simplified, manufacturing costs may be reduced, the number of masks used to manufacture a TFT may be reduced, and an aperture ratio may be increased. In contrast, where a touch screen unit is separately manufactured and then attached to the outside of the organic light emitting display apparatus, manufacturing costs may be increased, it may be difficult to combine the touch screen unit with an organic light emitting display apparatus, and the thickness of the resultant organic light emitting display apparatus may be significantly increased.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display apparatus, comprising:
a substrate;
a first touch sensing electrode layer on the substrate;
a first protective layer on the substrate, the first protective layer covering the first touch sensing electrode layer;
a ground layer on the first protective layer, the ground layer being electrically grounded;
a second touch sensing electrode layer between the first protective layer and the ground layer;
a second protective layer between the second touch sensing electrode layer and the ground layer;
an insulating layer on the ground layer; and
an organic light emitting device on the insulating layer, wherein at least a portion of the second touch sensing electrode layer is substantially coplanar with the first touch sensing electrode layer, and wherein the first touch sensing electrode layer, the first protective layer, and the second touch sensing electrode layer overlap at at least one position to form a sensing capacitor for sensing a touch, an electrostatic capacitance of the capacitor maintained at a substantially constant level based on a voltage applied to one of the first or second touch sensing electrode layers when no touch is sensed.

2. The organic light emitting display apparatus as claimed in claim 1, wherein the second touch sensing electrode layer includes an optically transparent material.

3. The organic light emitting display apparatus as claimed in claim 2, wherein the optically transparent material includes at least one of ITO, IZO, ZnO, and $In_2O_3$.

4. The organic light emitting display apparatus as claimed in claim 1, wherein the second protective layer includes an inorganic insulating material.

5. The organic light emitting display apparatus as claimed in claim 1, further comprising a plurality of thin film transistors on the insulating layer, wherein a plurality of the organic light emitting devices are on the insulating layer, each of the organic light emitting devices including:
a first electrode electrically connected to a corresponding thin film transistor,
a second electrode on the first electrode, and
an organic emission layer between the first electrode and the second electrode.

6. The organic light emitting display apparatus as claimed in claim 5, wherein the substrate includes a transparent glass material.

7. The organic light emitting display apparatus as claimed in claim 5, wherein each of the ground layer and the first touch sensing electrode layer includes an optically transparent material.

8. The organic light emitting display apparatus as claimed in claim 5, wherein each of the thin film transistors includes:
an active layer having a channel region, a source region, and a drain region;
a gate electrode corresponding to the channel region, and
source and drain electrodes connected to the source and drain regions,
wherein the first electrode of the organic light emitting device and the gate electrode include a same material and are formed on the same layer.

9. The organic light emitting display apparatus as claimed in claim 8, wherein the first electrode and the gate electrode each includes an optically transparent material.

10. The organic light emitting display apparatus as claimed in claim 5, wherein:
each of the thin film transistors includes:
an active layer having a channel region, a source region, and a drain region;
a gate electrode corresponding to the channel region; and
source and drain electrodes connected to the source and drain regions, and
the first electrode of the organic light emitting device and the source and drain electrodes include a same material and are formed on the same layer.

11. The organic light emitting display apparatus as claimed in claim 10, wherein the first electrode, the source electrode, and the drain electrode each includes an optically transparent material.

12. The organic light emitting display apparatus as claimed in claim 11, wherein the optically transparent material includes at least one of ITO, IZO, ZnO, and $In_2O_3$.

13. The organic light emitting display apparatus as claimed in claim 1, wherein:
a first portion of the second touch sensing electrode layer is substantially coplanar with the first touch sensing electrode layer, and
a second portion of the second touch sensing electrode layer overlaps the first touch sensing electrode layer.

14. The organic light emitting display apparatus as claimed in claim 13, wherein:
the first touch sensing electrode layer includes a plurality of spaced sections, and
the first portion of the second touch sensing electrode layer is between two of the spaced sections of the first touch sensing electrode layer.

15. The organic light emitting display apparatus as claimed in claim 1, wherein the portion of the second touch sensing electrode layer is on a same surface of the substrate as the first touch sensing electrode layer.

16. The organic light emitting display apparatus as claimed in claim 1, wherein an electrostatic capacitance between the first touch sensing electrode layer and the portion of the second touch sensing electrode layer changes based on a touch.

17. The organic light emitting display apparatus as claimed in claim 1, wherein:
the first and second touch sensing electrode layers overlap at at least one position to form a first capacitor, one of the first or second touch sensing electrode layers and a pointing object form a second capacitor in series with the first capacitor, and a change in electrostatic capacitance of the first and second capacitors indicative of a touch.

18. The organic light emitting display apparatus as claimed in claim 17, wherein the electrostatic capacitance of the first capacitor is maintained at a substantially constant level based on a voltage applied to one of the first or second touch sensing electrode layers when no touch is sensed, and the electrostatic capacitance of the first capacitor changes to a different level when a touch is sensed.

19. The organic light emitting display apparatus as claimed in claim 1, wherein the ground layer overlaps the first and second touch sensing electrode layers.

* * * * *